United States Patent [19]
Bassett et al.

[11] Patent Number: 5,127,008
[45] Date of Patent: Jun. 30, 1992

[54] INTEGRATED CIRCUIT DRIVER INHIBIT CONTROL TEST METHOD

[75] Inventors: Robert W. Bassett, Essex; Pamela S. Gillis, Jericho; Jeannie T. H. Panner, Underhill Center; Douglas W. Stout, Milton; Mark E. Turner, Colchester, all of Vt.

[73] Assignee: International Business Machines Corporation, Armonk, N.Y.

[21] Appl. No.: 471,249

[22] Filed: Jan. 25, 1990

[51] Int. Cl.⁵ .............................................. G06F 11/00
[52] U.S. Cl. ................................. 371/22.3; 371/22.1
[58] Field of Search ................. 371/22.3, 22.1, 25.1, 371/22.5, 22.6, 15.1; 364/488; 324/73.1, 158 R

[56] References Cited

U.S. PATENT DOCUMENTS

| | | | |
|---|---|---|---|
| 4,782,283 | 11/1988 | Zasio | 371/22.3 |
| 4,862,068 | 8/1989 | Kawashima | 371/22.3 X |
| 4,879,718 | 11/1989 | Sanner | 371/22.3 |
| 4,931,723 | 6/1990 | Jeffrey | 371/22.3 |

Primary Examiner—Robert W. Beausoliel
Attorney, Agent, or Firm—J. Dennis Moore

[57] ABSTRACT

A method and apparatus for designing very large scale integrated circuit devices, most particularly level sensitive scan design (LSSD) devices, by inclusion of a plurality of distributed delay lines originating at input terminals of the device, and controlling the inhibiting and enabling of driver circuits connected to the output terminals of the device, as required to regulate operation of device drivers during a plurality of testing operations.

14 Claims, 11 Drawing Sheets

Fig. 12.

| TYPE OF OPERATION | CIRCUITS TESTED | DELAY LINE TYPE | | | |
|---|---|---|---|---|---|
| | | DI1 | DI2 | DI3 | DI4 |
| WAFER TESTING | I/SRL → SRL | O | S/P | S/P | O |
| | → DO/DO → | P | S/P | S/P | P |
| SINGLE-CHIP MODULE TESTING | I/SRL → SRL | O | S/P | - | - |
| | → DO/DO → | P | S/P | - | - |
| SCM BURN-IN TESTING | I/SRL → SRL | O | O | - | - |
| | → DO/DO → | O | O | - | - |
| MULTICHIP MODULE TESTING | I/SRL → SRL | O | S/P | 1/S | S |
| | → DO/DO → | P | S/P | 1/S | S |
| MCM BURN-IN STRESS | I/SRL → SRL | O | O | 1/S | S |
| | → DO/DO → | O | O | 1/S | S |

KEY:  O = DISABLED
      1 = ENABLED
      P = PULSED FOR SOS CONTROL
      S = SWITCHED TO O OR 1 AS REQUIRED
      - = NOT APPLICABLE

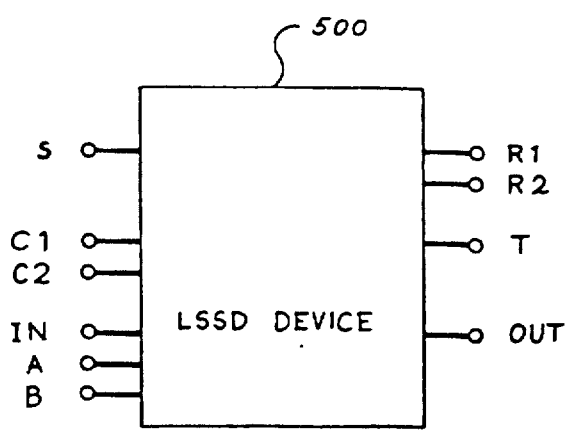

Fig. 13.

ns the operation of the circuits on semiconductor devices that directly drive the output terminals of such devices. Each of these circuits, which are called off-chip drivers, supply a logical data value to their output terminal as computed by the internal functional circuits of the semiconductor chip. Such data values are supplied to the corresponding output terminal of a driver circuit only when the control input to that circuit specifies that it should be active or enabled. Alternatively, the control value may specify that the driver circuit should be inhibited or disabled, wherein
INTEGRATED CIRCUIT DRIVER INHIBIT CONTROL TEST METHOD

BACKGROUND OF THE INVENTION

1. Field of the Invention

This invention relates to testing, and more particularly to the design of very large scale integrated ("VLSI") circuit devices so that they can be tested efficiently during several different testing operations.

2. Background Art

VLSI circuit devices, containing thousands of functional circuit elements on a single semiconductor chip, must be tested at several different stages during the manufacturing of the electronic data processing systems made from such devices, so that the correct fabrication of the devices themselves, and of the interconnections between them, may be assured. The first testing operation is performed on an individual device when it has been initially fabricated on a semiconductor wafer. Interconnection and communication between the device and its testing apparatus is achieved by means of a mechanism called a wafer stepper that moves a set of electrical probes above the top surface of the wafer, and causes those probes to achieve simultaneous physical contact with all the input and output terminals of an individual device. This process continues until all devices on the wafer have been contacted and tested. This first testing operation is called wafer (or chip) testing.

After the completion of wafer testing, the individual semiconductor chips are separated from the wafer by a dicing process. Those devices which were classified as functionally good by the wafer testing operation are next assembled in protective packages called modules. Numerous types of module packages exist, and they can be assembled by various bonding and encapsulation processes. Modules may contain one or a plurality of semiconductor chips. Those modules containing one chip are called single-chip modules (SCMs). Those modules containing a plurality of chips are called multi-chip modules (MCMs).

Modules are subjected to two different types of testing operations. The first of these operations is performed on an individual module package which is connected to its testing apparatus by a pluggable mechanism called a module socket into which the electrical contact pins of the module are secured. This operation is called module testing, and its objectives are to verify the correctness of the module assembly process, and to reverify the continuing functionality of the chip(s) contained in the module.

The second module testing process is performed when it is necessary to enhance the operational reliability of shipped modules, by accelerating and provoking the immediate failure of those correctly but marginally fabricated devices and modules which would otherwise fail early in their expected operational lifespan (e.g., within the first 1000 power-on hours). This is done by exposing the modules to elevated temperature and power-supply voltage stress conditions, and by repeatedly testing the modules under such conditions over an extended time duration (e.g., several hours). This second module testing operation is called burn-in. Since the burn-in operation is a long-duration process requiring special thermal and electrical conditions, it is typically performed simultaneously on groups of functionally identical modules. These modules are secured in module sockets that are permanently mounted on the surface of a specially-designed printed circuit board that is used specifically for this burn-in operation. Electrical access to the input and output terminals of the modules on each burn-in board is normally achieved by means of metal wiring on the top and bottom surfaces of the board, such wiring providing electrical conduction paths from the input and output terminals of each module socket to a connector on the edge of the board, which is connected through the wall of the thermal chamber to the testing apparatus.

The burn-in process is performed by applying the elevated temperature and power-supply voltage conditions required, after which the module test stimulus is applied repetitively to input terminals of the modules mounted on the burn-in boards. For each cycle of repetition, test stimulus is applied to all modules simultaneously and expected test response is monitored for one module only. The modules are monitored in rotation throughout the duration of the burn-in process. A module is said to be undergoing burn-in stress when its inputs are receiving test stimulus but no monitoring of its outputs for expected response is being done. A module is said to be undergoing burn-in testing when its inputs are receiving test stimulus and its outputs are being simultaneously monitored for their expected output response. Alternatively, a modified burn-in process may also be used, wherein only the burn-in stress operation is performed (i.e., burn-in testing is omitted), followed by subsequent reapplication of the module testing operation under conditions of ambient temperature and nominal power supply voltage.

Modules that have successfully passed both the module testing and burn-in operations are then permanently mounted on a printed circuit card or board whose electrical wiring pattern contains the interconnections between such modules so as to realize the function of the desired electronic data processing system or subsystem. Once again, this assembly process must be verified, including the correctness of the wiring interconnections as well as the continued functionality of the constituent modules and semiconductor chips. This card or board testing operation is done in one or both of the following ways: (1) by testing the card or board as a complete functional unit, by connecting the testing apparatus to the input and output terminal edge connections of said card or board; or (2) by retesting the individual constituent modules after they have all been permanently mounted on the card or board assembly, by obtaining physical access to the input and output terminals of each module in succession by means of a suitable fixturing apparatus, and by thereafter reapplying the module test for that module. The first of these operations is called through-the-pins card testing, and the second is called in-circuit or module-in-place card testing.

Each of the wafer, module, and card or board testing operations as previously described place differing but similar requirements on the operation of the circuits on semiconductor devices that directly drive the output terminals of such devices. Each of these circuits, which are called off-chip drivers, supply a logical data value to their output terminal as computed by the internal functional circuits of the semiconductor chip. Such data values are supplied to the corresponding output terminal of a driver circuit only when the control input to that circuit specifies that it should be active or enabled. Alternatively, the control value may specify that the driver circuit should be inhibited or disabled, wherein the circuit is said to be at its high-impedance state and is electrically disconnected from its corresponding output terminal.

During wafer and module testing, and more particularly when such testing is performed using a scan-based testing method such as a level sensitive scan design ("LSSD") testing method, a multiplicity of drivers may switch substantially simultaneously as a consequence of the application of test signal values to the input terminals of the device, and particularly as a consequence of the pulsed activation of either scan clocks or functional system clocks. The resulting switching activity can saturate the local capacity of the on-chip power-supply distribution network when an excessive number of drivers supplied by the same local powering network are caused to switch substantially simultaneously in the same logical direction (e.g., from logical 0 to logical 1). This simultaneous-output-switching event can have an adverse effect on the delivery of power to other circuit elements sharing the same local power-supply network, such as the circuits that receive logical values from the input terminals of the semiconductor chip. These circuits, which are called on-chip receivers or simply receivers, interpret the logical values placed on the input terminals and distribute those values to the internal circuit elements of the chip as needed to realize its operating function.

During a simultaneous-output-switching event, the substantially instantaneous power demand of the switching drivers can cause a shift in the voltage or ground reference values of the local power-supply network, which may therefore cause one or more receivers to incorrectly interpret the logical test stimulus value placed on their input terminals. The incorrect stimulus values distributed by the receivers to the internal circuit elements can thus cause a device output response different from the expected response, even for a correctly-fabricated chip. Therefore, it is desirable to provide a means to control off-chip driver enabling and inhibiting to prevent the occurrence of simultaneous-output-switching events, thereby preventing the improper classification of correctly-fabricated devices as defective devices.

During module testing or burn-in of multichip modules, and more particularly when such testing is performed using a scan-based testing method such as an LSSD testing method, in where the output drivers of two or more chips are interconnected by common wiring, it is possible for the test stimulus to simultaneously activate two or more of such interconnected drivers such that these drivers provide opposing data values at their respective output terminals at the same time. This condition, which is called a driver-contention event, can cause an excessive power-supply current flow through the contending driver circuits that may immediately, or ultimately by repetition, result in the destruction of the driver circuits. Therefore, it is desirable to provide a means to control off-chip driver enabling and inhibiting to prevent the occurrence of driver-contention events, thereby preventing the destruction of correctly-fabricated devices and modules.

During burn-in of single-chip modules or multichip modules, it is desirable to maximize the number of identical module parts that can be simultaneously fitted and exercised in the thermal chamber. Module burn-in boards are therefore designed to maximize the number of module sockets that can be mounted on such boards, and to minimize the complexity of interconnect wiring between such sockets and the board edge connection to the testing apparatus. It is also desirable that the wiring pattern of such boards be suitable to be used for burn-in of different module functional designs characterized by differing uses of the module input and output terminals (e.g., terminal I/0 may be used as an input on module design A and as an output on module design B). These objectives are achieved by establishing common wiring paths on the burn-in board between its edge connection and the corresponding module input or output terminals at each socket location. Module functional input terminals at all socket locations are thus wired in common, permitting the simultaneous application of test input stimulus to all modules during the burn-in stress operation. However, all module output terminals at each socket location are then also identically wired in common, thus precluding the selective monitoring of individual modules as required by the burn-in testing operation. Moreover, although common module input stimulus should result in identical module output response for correctly fabricated modules, the presence of a faulty module (or faulty burn-in board) can produce driver-contention events as previously described, although in this instance between the corresponding driver circuits on separate modules. During the extended duration of the burn-in operation, such occurrences could result in the progressive destruction of all modules occupying the same board. Therefore, it is desirable to provide a means on each module to simultaneously inhibit all driver circuits connected to module terminals, the means being controlled from module input terminals, such terminals at each burn-in board socket location being made separately accessible to the burn-in testing apparatus by means of separate wiring connections between the burn-in board edge connector and the control terminals at each socket location.

During card or board testing operations, similar means for semiconductor device driver control should be provided for prevention of driver-contention events as previously described for multichip module testing and module burn-in operations. To perform through-the-pins card testing without the risk of driver contention, each module should be designed with means to inhibit those off-module drivers whose output terminals are functionally wired in common with the output terminals of other modules, such means being independently controllable so that upon application of test stimulus no more than one driver is ever simultaneously enabled for any common connection between two or more drivers. To perform in-circuit card testing without the risk of driver contention, each module should be designed with means to inhibit those off-module drivers whose output terminals are functionally wired in common with either the input or output terminals of other modules, and such means should be independently controllable for each module during such card testing. Thus, through-the-pins card testing requirements are similar to those of multichip module testing, and in-circuit card testing requirements are similar to those of module burn-in.

FIG. 1 shows a schematic diagram of a level sensitive scan design (LSSD) logic device, frequently used in conjunction with VLSI circuit testing as described herein. LSSD logic devices consist of both combinational logic elements and sequential logic elements. In LSSD, all sequential logic elements are realized as shift register latches (SRLs), which are exemplified in FIG. 1 by Shift Register Latch Sets 1 and 2. The combinational logic elements are exemplified by Combinational Networks 3, 4, and 5, and by AND gates 6 and 7.

In general, testing of LSSD logic devices is accomplished by loading test input stimulus values into Shift Register Latch Sets 1 and 2, by applying test input stimulus to data input terminals S, by pulsed activation of either system clock C1 or system clock C2 (but not both at the same time) to load new data values into either Shift Register Latch Set 1 or 2 respectively, by measurement of output response values on data output terminal R, and by unloading test output response values from Shift Register Latch Sets 1 and 2. Loading of test input stimulus data values into Shift Register Latch Sets 1 and 2 is accomplished by placing a data value on scan input terminal IN, followed by pulsed activation of scan clock A, and then followed by pulsed activation of scan clock B. To complete loading of all SRLs in Shift Register Latch Sets 1 and 2, this scan clock A and B pulse sequence must be repeated with new data values on scan input terminal IN for as many cycles as the total number of SRLs in Shift Register Latch Sets 1 and 2. Unloading of test output response data values from Shift Register Latch Sets 1 and 2 is accomplished in similar fashion by applying a repetition of scan clock A and B pulse pairs, and by measuring the output response on scan output terminal OUT after the application of each pulse pair.

For purposes of describing the preferred embodiment of the present invention, it is convenient to introduce a classification scheme to distinguish four categories of input and output signals that are used during testing. Referring to the LSSD device of FIG. 1, for example, all those inputs that must be manipulated during testing to load logical values into Shift Register Latch Sets 1 and 2 are hereafter called test-function inputs, and are exemplified in FIG. 1 by the input terminals A, B, IN, C1 and C2. All those outputs that must be manipulated during testing to unload logical values from Shift Register Latch Sets 1 and 2 are hereafter called test-function outputs, and are exemplified in FIG. 1 by output terminal OUT. Additionally, output terminals that may be functionally required to selectively transfer test-function input values by combinational logic means to the output terminals of the device—as exemplified in FIG. 1 by output terminal T which can so transfer the value of test-function input terminal C1 by means of AND gate 6—are hereafter also called test-function outputs. All LSSD device inputs other than those previously discussed, as exemplified in FIG. 1 by input terminal S, are hereafter called data inputs. All LSSD device outputs other than those previously discussed, as exemplified by output terminals R1 and R2 in FIG. 1, are hereafter called data outputs.

A prior approach to simultaneous-output-switching event prevention is illustrated in FIGS. 2A and 2B. FIG. 2A shows a single receiver circuit 10 driving two resistive polysilicon delay lines 12, 14 which propagate the input waveform around the periphery of a semiconductor device (not shown), each line traversing two adjacent edges of the device. All driver off-chip circuits 16 are located at the chip periphery, and each is automatically attached to this delay line structure at its point of closest proximity to one of the delay lines 12, 14.

FIG. 2B shows an off-chip driver 16, consisting of driver element 18 and AND gate element 20. Driver element 18 supplies the logic value provided on the System Data input terminal of off-chip driver 16 to its Chip Data Output terminal, only when activated by means of AND gate element 20, which requires that logical 1 signal values be simultaneously present on both the System Enable input terminal and the Test Enable input terminal of off-chip driver 16. When a logical 0 value is present on either the System enable or the Test Enable of off-chip driver 16, then driver element 18 is disabled and is said to be at its high-impedance state, wherein it is electrically disconnected from the Chip Output Terminal of off-chip driver 16. This structure prevents driver-contention events for single-chip modules during burn-in and during in-circuit card testing, provided in the latter case that the functional card design permits the testing apparatus to have separate independent access to the driver inhibit control input terminal of each module. However, the delay provided by delay lines 12, 14, can be much longer than desired, especially where chip size is relatively large, resulting in an excessively long polysilicon line, and where the number of OCDs on the chip is relatively low.

FIG. 3 is a timing diagram of an LSSD tester cycle required to utilize the scheme of FIG. 2 in a relatively large chip. Note particularly that the turn-on and turn-off times of the driver inhibit control input are the dominant factors in the tester cycle time. For VLSI circuit devices, this time is quite long as a consequence of the large time constant of the resistive delay line.

FIG. 4 is an improvement of the scheme shown in FIG. 2, wherein added inverter 30, transistors 32 and low-resistance metal interconnect wiring 34 realize an asymmetric switching behavior, such that the turn-off time of the driver inhibit control is much shorter than the turn-on time. Since this structure is logically identical to that of FIG. 2, but merely exhibits a faster switching response for the turn-off transition, it thus also satisfies the requirements to prevent driver-contention events for single-chip modules during burn-in and during in-circuit card testing, again provided in the latter case that the functional card design permits the testing apparatus to have separate independent access to the driver inhibit control input terminal of each module. However, it offers no improvement to driver inhibit turn-on transition delay.

FIG. 5 is a timing diagram of an LSSD tester cycle, like that of FIG. 3, required to utilize the scheme of FIG. 4. Note that although a significant improvement is realized in comparison to the cycle time shown in FIG. 3, the cycling of the driver inhibit control input is still a dominant factor in the total tester cycle time.

FIG. 6 illustrates yet another alternative approach to driver control that has been used for avoidance of simultaneous-output-switching events in connection with OCDs 16. In this case, the delay function is realized using active circuit elements 40 (instead of the resistive delay lines 12, 14 used in the methods described in FIG. 2 and FIG. 4) formed from internal circuit elements (not shown) that otherwise would have been used for functional system logic. Since the switching response of these elements 40 is both symmetric and faster than those delay line elements previously described, the tester cycle appears essentially as in FIG. 2, but requires shorter turn-on and turn-off times for the driver inhibit control, thereby yielding a reduced cycle time. However, since this delay line is realized only at the expense of circuit elements that otherwise would have been used in the functional chip design, this scheme therefore also tends to result in a plurality of off-chip drivers being operated from a single delay stage. Inasmuch as all drivers connected to a particular stage may therefore be activated simultaneously, the scheme shown in FIG. 6 thus cannot be guaranteed to avoid all simultaneous-output-switching events, and is dependent on the number of driver elements so connected, and on the relative placement of said driver elements with regard to the associated on-chip power-supply network design.

While these prior design and testing methods have individually addressed a particular problem of driver control, and have attempted a specific solution for one or two of the problems associated with the cited testing operations, no previously described method has established a comprehensive driver-control design method that can be successively utilized to satisfy the driver control design requirements for each of the cited testing operations.

SUMMARY OF THE INVENTION

It is therefore the object of this invention to provide a method to control the inhibiting and enabling of off-chip drivers for a plurality of different testing operations, and particularly for those testing operations required to be performed on semiconductor chips, on single-chip modules, and on multichip modules.

It is a further object of this invention to realize the preceding method using a simple apparatus, comprising a small number of semiconductor device input terminals and a simple means of distributing input signals from these terminals through a circuit network to achieve distributed delay control for inhibiting and enabling of off-chip drivers.

It is yet a further object of this invention to realize the preceding method in an efficient manner for scan-based testing, and most particularly for level sensitive scan design (LSSD) testing, such that the time required to apply the totality of such tests is not substantially increased by the apparatus and method employed to ensure avoidance of simultaneous-output-switching events and driver-contention events during such testing operations.

BRIEF DESCRIPTION OF THE DRAWINGS

FIG. 12 is a table specifying the type of control function applied during scan-based testing of chips and modules to the semiconductor device input terminals controlling distributed delay lines of the type illustrated in FIG. 7, using either the four-line control scheme of FIG. 8, or the three-line control scheme of FIG. 10.

FIG. 13 is a simplified block diagram of the LSSD device shown in FIG. 1, wherein all detailed elements shown in FIG. 1 have been replaced by a single block 500, and retaining only the input and output terminals of the FIG. 1 device.

DETAILED DESCRIPTION OF THE PREFERRED EMBODIMENTS

Figure 7A:
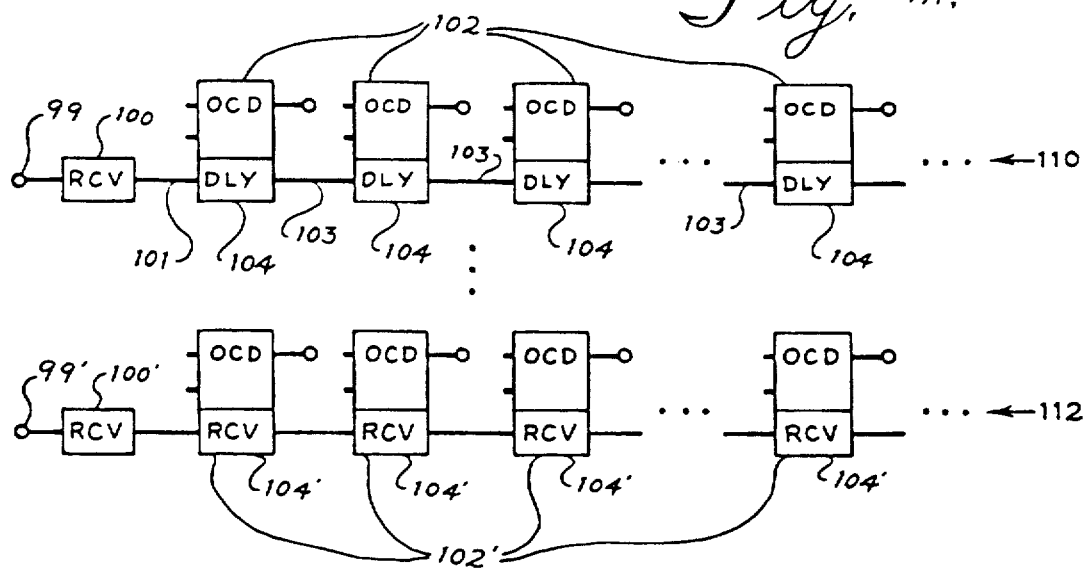
FIG. 7 is a block diagram of the interconnection of off-chip driver circuits 102, 102′, containing an integrated delay element 104, 104′, to form a distributed delay line, wherein that element supplies the driver inhibit test control signal at an incremental timing offset both to its associated driver element and to a single succeeding off-chip driver circuit similarly equipped.
Figure 7B:
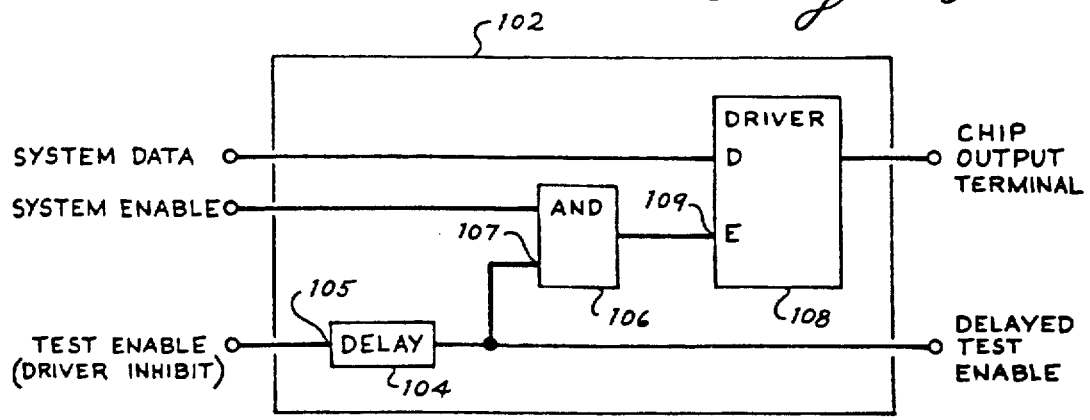

The preferred embodiment of the present invention is shown in FIGS. 7A and 7B. FIG. 7B shows an off-chip driver 102, comprising driver circuit 108, AND gate 106, and delay element 104. The driver circuit 108 delivers the value contained on its System Data input line to its Chip Output Terminal only if an activating logical value (logic 1) is present at its enable input 109. This value of enable input 109 is computed by AND gate 106, such that a logical 1 value on both its System Enable input and its input 107 constitutes an activating value for enable input 109. The input 107 to AND gate 106 is computed as the output of delay element 104, such computation having the effect of delivering each logic value presented on its Test Enable input 105 to input 107 at a later instant in time as determined by the performance characteristic of delay element 104. The value placed on input 107 of AND gate 106 is also made available as the Delayed Test Enable output of off-chip driver element 102. It is to be understood that in accordance with the principles of the present invention, the output of a single delay 104 could also be connected to two or more AND gate 107 - driver 109 combinations.

FIG. 7A depicts two instances of a delay line used for off-chip driver control. Each delay line 110, 112, is formed by the interconnection of a multiplicity of off-chip drivers 102, 102', where each driver 102' is the same as off-chip driver 102 shown in FIG. 7B. Each delay line 110, 112, propagates a logic signal value originating at a semiconductor device input terminal 99, 99', through its corresponding receiver circuit 100, 100'. Receiver 100 propagates the signal value placed on input terminal 99 by means of interconnecting wire 101 to the first off-chip driver 102 of each delay line, where it is connected to the Test Enable input 105 of that driver 102 as previously described in connection with FIG. 7B. All subsequent connections of the delay line are made to successive off-chip drivers 102 by means of interconnecting wires 103 which describe a point-to-point connection, each being between the Delayed Test Enable output of off-chip driver 102 in FIG. 7B and the Test Enable input of a subsequent instance of driver 102. It is to be understood that in accordance with the principles of the present invention, the output of a single receiver 100 could also be connected in parallel to two or more drivers 102.

All off-chip driver circuits 102, 102', on the semiconductor device are connected in this manner to exactly one of a plurality of delay lines of which two instances 110, 112, are shown in FIG. 7A. In this way, all driver circuits 102, 102', connected to a particular delay line can be disabled for avoidance of driver contention during testing by permitting the testing apparatus to place an inhibiting value (i.e., logical 0) as necessary on the corresponding driver inhibit control input terminal 99, 99'. More significantly, however, when an enabling value (i.e., logical 1) is placed on a control input terminal 99, 99', the timing of the enabling of each off-chip driver circuit 102, 102', is uniquely offset for simultaneous-output-switching event avoidance by its own integrated delay element 104, 104'. The time delay through delay element 104, 104' can be designed to be the minimum necessary for simultaneous-switching avoidance in the worst case of all off-chip drivers 102, 102', whose power is supplied by the same local on-chip power-supply distribution network (not shown) also being connected to the same delay line 110, 112. The total switching time of each delay line 110, 112, is directly proportional to the number of off-chip driver circuits 102, 102', attached to that line. Thus lines controlling few driver circuits are capable of being cycled much more rapidly than those lines controlling many drivers.

Figure 8:
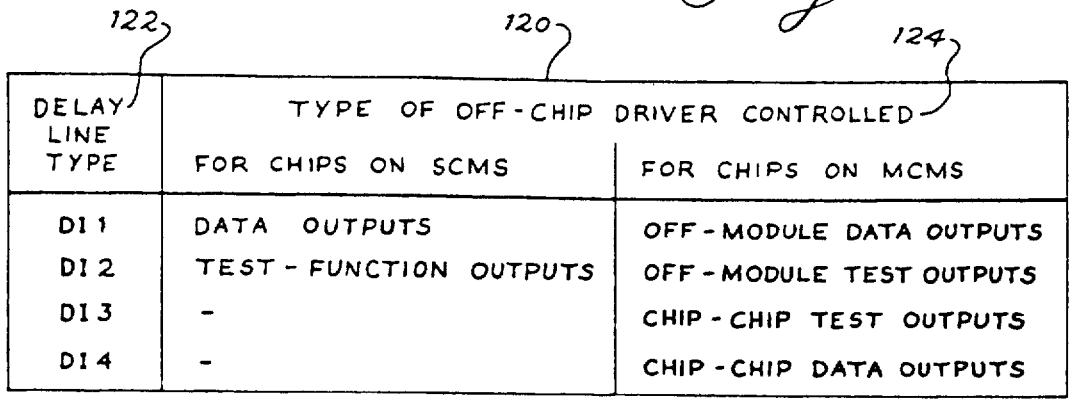
FIG. 8 is a table 120 specifying a classification scheme for assigning the interconnection and control of a particular driver to one of four delay lines of the type illustrated in FIG. 7, based on the scan-testing uses of said driver.

The preferred set of rules for assigning each off-chip driver to membership in a particular delay line are summarized in FIG. 8. FIG. 8 consists of table 120 which relates two categories of information, one being the Delay Line Type 122 and the other being the Type of Off-Chip Driver Controlled 124. Inasmuch as the delay line assignment criteria differs slightly depending on whether the chip will be packaged in a single-chip module (SCM) or a multichip module (MCM), the Type of Off-Chip Driver Controlled 124 has been further sub-categorized to differentiate between those rules applied For Chips on SCMs, and those applied For Chips on MCMs.

This preferred set of assignment rules establish four distinct categories (DI1, DI2, DI3, DI4) of Delay Line Types 122. Each category of delay line is exercised in a particular and unique manner across the totality of chip and module testing operations as will be subsequently described.

For Chips on SCMs, these rules require that only two delay line categories be used. All those off-chip drivers associated with LSSD data output signals are assigned to the DI1 delay line type. All those off-chip drivers associated with LSSD test-function output signals are assigned to the DI2 delay line type.

For Chips on MCMs, these rules distinguish two additional delay line categories, based on whether the corresponding off-chip driver is connected to a module output terminal, to one or more chip input terminals of other chips within the multichip module, or to both module outputs and chip inputs. LSSD data output signals may be simultaneously connected to both module outputs and chip inputs. All those off-chip drivers associated with LSSD data output signals that are connected to MCM data output terminals and which may also be connected to other chip inputs are assigned to the DI1 delay line type. However, those off-chip drivers associated with LSSD data output signals that are connected to other chip inputs and which may also be connected to other chip data output signals are assigned to the DI4 delay line type.

This classification scheme both assumes and requires that it is impermissible for a particular LSSD test-function output signal from a chip to be connected both to a module output and to a chip input. It is also impermissible for an LSSD test-function output signal from a chip to be connected by common module wiring to any other chip output signal unless said signal is also an LSSD test-function output signal. All those off-chip drivers associated with LSSD test-function output signals that are connected only to MCM output signals that are connected only to the other chip input terminals are assigned to the DI3 delay line type.

Figure 9:
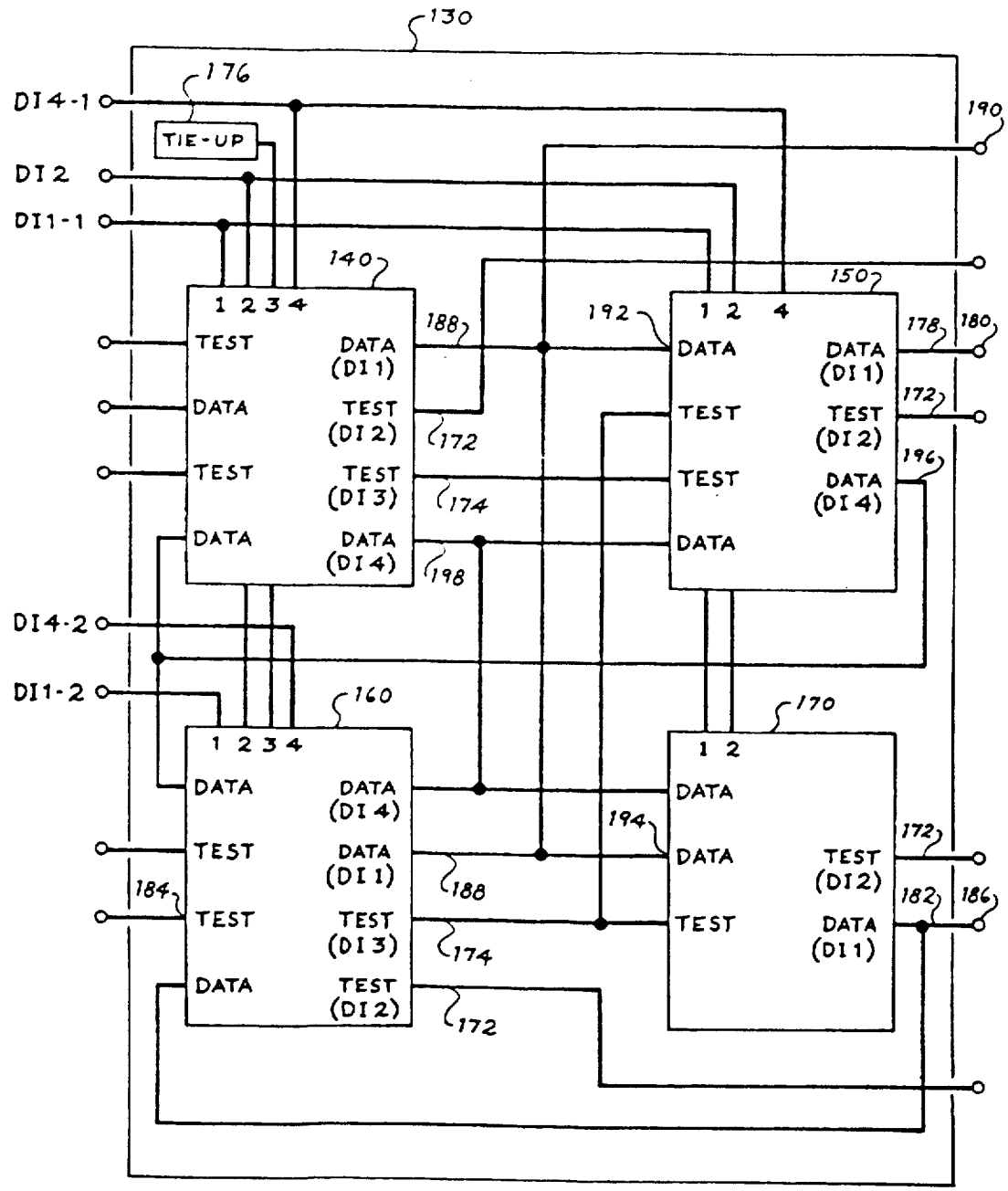
FIG. 9 is a block diagram of a multichip module comprising four semiconductor chips, for purposes of exemplifying the interconnection and control scheme of FIG. 8.

FIG. 9 shows a multichip module 130 design example to which the delay line assignment rules of FIG. 8 have been applied. Multichip module 130 contains four chips 140, 150, 160, 170. For each chip 140, 150, 160, 170 the chip input terminals required for off-chip driver control are located on the top of each block, and are labelled 1, 2, 3, 4—corresponding to delay line types DI1, DI2, DI3, and DI4 respectively. For chip 160, the delay line inputs labelled 2 and 3 are understood to be extensions of the module wiring entering delay line inputs 2 and 3 of chip 140. Similarly for chip 170, the delay line inputs labelled 1 and 2 are to be construed as extensions of the module wiring entering delay line inputs 1 and 2 of chip 150. All lines connected to the left edge of each chip 140, 150, 160, 170, are to be understood as signal lines attaching to the input terminals of such chips, and all lines connected to the right edge of each are to be construed as signal lines attaching to the output terminals of such chips.

FIG. 9 illustrates a sampling of the interconnections permitted by the rules embodied in FIG. 8. For example, test-function output signals 172 from each of the chips 140, 150, 160, 170, are connected only to output terminals of multichip module 130, and in each case the associated off-chip driver (not shown) internal to such chip is controlled by an on-chip delay line (not shown) connected to the DI2 input terminal of multichip module 130.

Test-function output signals 174 from chips 140 and 160 are shown connecting only to input terminals on chips 150 and 170, hence the corresponding off-chip drivers (not shown) internal to such chips are controlled by on-chip delay lines (not shown) of type DI3. The DI3 control input terminals of chips 140 and 160 are shown as driven by the output of tie-up block 176. Tie-up block 176 functions to supply a constant logical 1 value to the DI3 inputs, thus permitting the corresponding off-chip driver enables to be constantly enabled as may be required for LSSD scanning and clocking control for module testing and burn-in. No test-function output signals from chips 150 or 170 are shown connected to the inputs of other chips, hence no DI3 control input is connected to them.

Data output signal 178 from chip 150 illustrates a simple case of an off-chip driver (not shown), internal to such chip, connected to a module output terminal 180, and thus being controlled by an on-chip delay line (not shown) of type DI1. Data output signal 182 from chip 170 illustrates a second case in which the off-chip driver (not shown) is connected to an input terminal 184 of chip 160 as well as to an output terminal 186 of multichip module 10, but is still controlled by an on-chip delay line of type DI1 as specified by the rules in FIG. 8.

Data output signal 188 illustrates a complex case, wherein signal 188, is connected to off-chip drivers (not shown) of both chips 140 and 160, is connected to an output terminal 190 of multichip module 130, and is also connected to input terminals 192 and 194, of chips 150 and 170 respectively. Once again, a driver control delay line of type DI1 is used as specified in FIG. 8. However, in order to use these type DI1 delay lines as driver-contention control inputs during any testing operation that may activate signal 188, it is necessary that these DI1 inputs be independently controllable from the input terminals of multichip module 130. Hence, the chip 140 type DI1 input is connected the input terminal labelled DI1-1 on multichip module 130, whereas the chip 160 type DI1 input is connected to a separate input terminal labelled DI1-2.

Data output signal 196 from chip 150 illustrates a simple case of an off-chip driver (not shown) connected only to chip input terminals on chips 140 and 160, which is therefore controlled by a driver control delay line of type DI4 as required in FIG. 8. Data output signal 198 again represents the more complex case, wherein it is connected to off-chip drivers (not shown) of chips 140 and 160, and is also connected to input terminals of chips 150 and 170. Since signal 198 is a data signal which is not connected to a module output terminal, its associated off-chip drivers (not shown) in chips 140 and 160 are also assigned to be controlled by driver control delay lines (not shown) of type DI4. However, in order to use these type DI4 delay lines as driver-contention control inputs during any testing operation that may activate signal 198, it is necessary that these DI4 inputs be independently controllable from the input terminals of multichip module 130. Hence, the chip 140 type DI4 input is connected the input terminal labelled DI4-1 on multichip module 130, whereas the chip 160 type DI4 input is connected to a separate input terminal labelled DI4-2.

Figure 10:
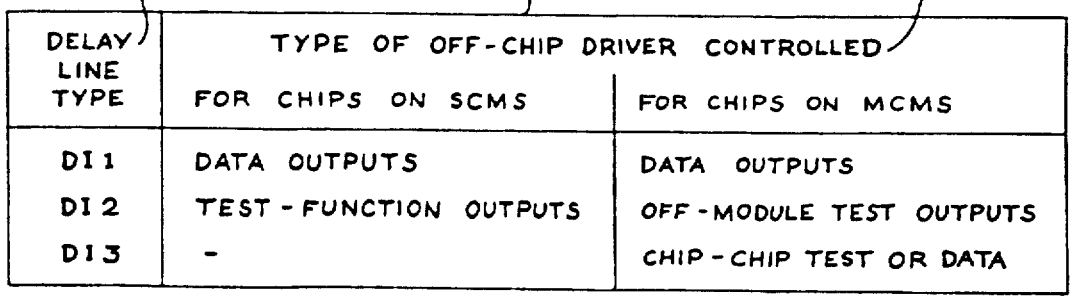
FIG. 10 is a table specifying a classification scheme for assigning the interconnection and control of a particular driver to one of three delay lines of the type illustrated in FIG. 7, based on the scan-testing uses of said driver.

A second alternative method of implementation uses a modified set of rules for assigning each off-chip driver to membership in a particular delay line. These alternative rules are summarized in FIG. 10. FIG. 10 consists of table 200 which relates two categories of information, one being the Delay Line Type 202 and the other being the Type of Off-Chip Driver Controlled 204. Inasmuch as the delay line assignment criteria differs slightly depending on whether the chip will be packaged in a single-chip module (SCM) or a multichip module (MCM), the Type of Off-Chip Driver Controlled 204 has been further subcategorized to differentiate between those rules applied For Chips on SCMs, and those applied For Chips on MCMs. Since the requirements For Chips on SCMs are identical to those spelled out and discussed in conjunction with FIG. 8, no further mention will hereafter be made of them.

This modified set of assignment rules establish three distinct categories (DI1, DI2, DI3) of Delay Line Types For Chips on MCMs. As in the case of FIG. 8, these rules distinguish driver-control categories for off-chip drivers of chips which will be packaged in multichip modules, based on whether the corresponding off-chip driver is connected to a module output terminal, to one or more chip input terminals of other chips within the multichip module, or to both module outputs and chip inputs.

As in the scheme of FIG. 8, LSSD data output signals may be simultaneously connected to both module outputs and chip inputs. All those off-chip drivers associated with LSSD data output signals that are connected to MCM data output terminals and which may also be connected to other chip inputs are assigned to the DI1 delay line type. In contrast to the classification scheme of FIG. 8, however, the classification scheme of FIG. 10 For Chips on MCMs, also permits those off-chip drivers associated with LSSD data output signals that are not connected to MCM data input signals but are instead connected to other chip inputs and which may also be connected to other chip data output signals to be assigned to the DI1 delay line type. In fact, this is the preferred connection strategy for such data output signals, and is intended to be used for all such signals except as subsequently described.

Also as in the scheme of FIG. 8, the classification scheme For Chips on MCMs in FIG. 10 both assumes and requires identical limitations on the interconnections between LSSD test-function output signals from chips and their connections to multichip module output terminals and to input terminals of other chips. Accordingly, the use of the DI2 delay line type to control all those off-chip drivers associated with LSSD test-function output signals that are connected only to MCM output terminals is identical to its use in FIG. 8.

Moreover, the DI3 delay line type is used identically For Chips on MCMs to control all those off-chip drivers associated with LSSD test-function output signals that are connected only to the other chip input terminals. In contrast to the case of FIG. 8, the definition of delay line type DI3 For Chips on MCMs in FIG. 10 also permits the delay line type DI3 to be optionally used in special circumstances for control of off-chip drivers associated with LSSD data output signals that are connected only to the data input terminals of other chips, and which are not connected to any multichip module output terminal, nor to an output signal of any other off-chip driver. Although the preceding restriction precludes the possibility of driver contention on such nets, this permission should be used with caution and only for a small number of such data output signals. This caution is a consequence of the general requirement on the operation of delay line type DI3 during multichip module testing, as it must normally be held active to permit the flow of LSSD test-function signals from one chip to another, and thus cannot be cycled active and inactive for the avoidance of simultaneous-output-switching events.

Figure 11:
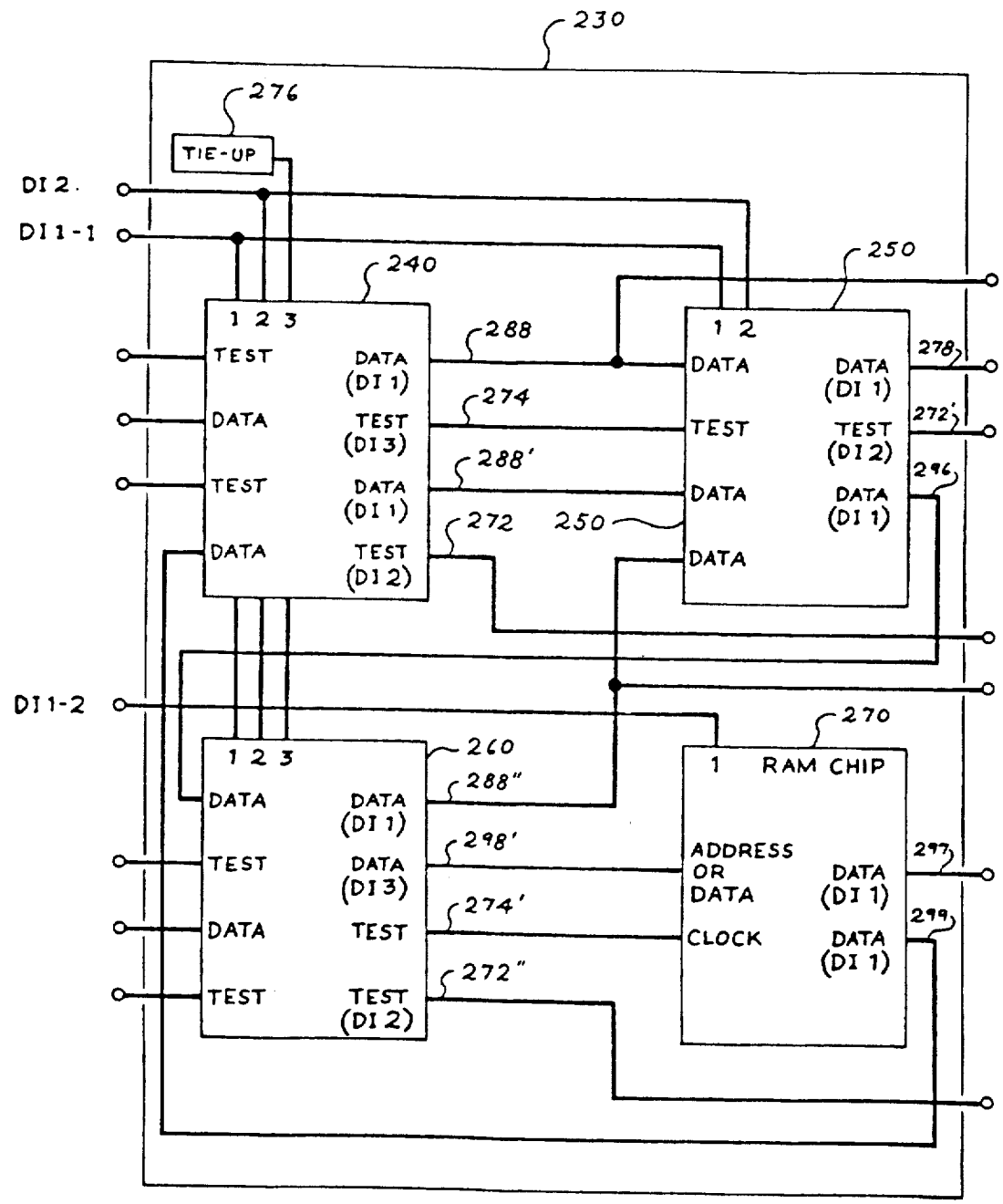
FIG. 11 is a block diagram of a multichip module comprising four semiconductor chips, for purposes of exemplifying the interconnection and control scheme of FIG. 10.

FIG. 11 shows a multichip module 230 design example illustrating the application of the delay line assignment rules of FIG. 10. Multichip module 230 contains four chips 240, 250, 260, and 270. The input and output labeling conventions for each block are identical with those stated for the example for FIG. 9, and consequently will not be repeated here. Similar elements to those on FIG. 9 have the same last two digits in their reference numerals. For example, tie-up block 276 has the same function and purpose as the tie-up block 176 in FIG. 9.

Chips 240, 250, and 260 are the same as semiconductor logic chips 140, 150 and 160 as shown and discussed in the previous example of FIG. 9. However, chip 270 in the current example is a random-access memory (RAM) chip, whose interconnection for testing purposes is discussed hereinbelow.

FIG. 11 illustrates several instances of the interconnections permitted by the rules embodied in FIG. 10. Cases which are substantially the same in form and function to those discussed in FIG. 9 are: (1) the control by means of delay line type DI1 (not shown) of the off-chip drivers (not shown) that supply data output signals 288, 278, 288'' from chips 240, 250, 260 respectively, to module output terminals of multichip module 230; (2) the control by means of delay line type DI2 (not shown) of the off-chip drivers (not shown) that supply test-function output signals 272, 272', 272'', from chips 240, 250, 260 respectively, to module output terminals of multichip module 230; and (3) the control by means of delay line type DI3 of the off-chip drivers that supply test-function input signals 274, 274', from chips 240 and 260, respectively to input terminals of chips 250 and 270, respectively.

Output signals 288', 296, from chips 240 and 250, respectively, are examples of data connections that are different under the rules specified in FIG. 10 as contrasted with those of FIG. 8. Signals 288', 296, depict data signal connections from chip 240 to chip 250, and from chip 250 to chip 260, and in each case such signal does not also connect to any output terminal of multichip module 230. However, the off-chip drivers on chips 240 and 250 that supply signals 288' and 296 are still controlled by means of delay lines (not shown) of type DI1.

Output signal 298' from chip 260 is an example of a data signal whose attached off-chip driver (not shown) is properly controlled by delay line type DI3 (not shown) under the classification scheme of FIG. 10. Signal 298' is connected to the address or data input terminals of RAM chip 270, for purposes of supplying a continuous stream of data input values from chip 260 to chip 270, which is particularly essential during burn-in stress operations. When using this method of interconnection, chip 270 is effectively treated as if it were a physical adjunct of chip 260. This scheme can be highly desirable and useful, provided that the total number of connections exemplified by signal 298' is sufficiently small, or alternatively that the placement of their associated off-chip driver circuits on chip 260 is such that the switching of all such driver circuits during module testing or burn-in operations cannot result in the occurrence of a simultaneous-output-switching event.

Finally, it is noted for completeness that the output signals 297, 299 of RAM chip 270 are considered to be data signals, hence their output inhibit control is denoted to be of type DI1. However, the total number of output signals from chip 270 is rather small, so that the output circuits of said chip may not be at risk of provoking a simultaneous-output-switching event. Thus, the inhibit of type DI1 on chip 270 need not provide the distributed delay function as described in FIG. 7. Since this inhibit provides only a driver-contention avoidance function, it has been shown as being connected separately to the multichip module 230 input terminal labelled as DI1-2, to emphasize this contrast to module 230 input terminal DI1-1, which is capable of being cycled for avoidance of simultaneous-output-switching events during multichip module testing operations.

The operation of delay lines constructed as described in FIG. 7 and in FIG. 9 for the purposes of off-chip driver switching control during various chip and module testing operations is summarized in FIG. 12. FIG. 12 illustrates a method of operation for a plurality of these delay lines, and is consistent either with the method of off-chip driver assignment to one of four delay line types as described in FIG. 8, or with the alternative method of off-chip driver assignment to one of three delay line types as described in FIG. 10. FIG. 12 consists of table 300 containing three information categories, which are the Type of Operation, the Circuits Tested, and the Delay Line Type.

The Type of Operation column contains five entries describing testing operations for which differing control sequences must be applied to the Delay Line Types. The first entry is for wafer testing of semi conductor chips. The second entry is for single-chip module testing, which is to be interpreted to include burn-in testing operations wherein the output terminals of the module are monitored for their expected response values. The third entry is for single-chip module burn-in stress operations, wherein test stimulus is applied to the input terminals of the module, but no monitoring of output response in performed. The fourth entry is for multichip module testing, which is to be interpreted to include burn-in testing operations wherein the output terminals of the module are monitored for their expected response values. The fifth and final entry is for multichip module burn-in stress operations, wherein test stimulus is applied to the input terminals of the module, but no monitoring of output response is performed.

The Circuits Tested column further differentiates each of the several testing operations described as entries in Type of Operation into two further subcategories of testing activities. This distinction is made inasmuch as scan-based testing methods, and more particularly level sensitive scan design (LSSD) methods, permit much testing to be performed with only the off-chip drivers connected to the LSSD test-function output terminals of a chip being activated. During such testing, all other off-chip drivers connected to the ordinary data output terminals of such chips may be simply disabled, thereby further limiting exposure to simultaneous-output-switching or driver contention problems.

In each case the notation "I/SRL→SRL" is understood to mean testing of those functional circuit elements wherein test stimulus values are applied first to SRLs (by means of a shift register load operation) and then to data input terminals. Test response values are monitored only using SRLs (by means of a shift register unload operation), and not using the data output terminals of the device.

The notation "→DO/DO→" is understood to mean testing of those functional circuit elements wherein the data output off-chip drivers must be enabled, either to monitor expected test response values at corresponding output terminals, or to transmit signal values to the data input terminals of another chip.

The Delay Line Type column describes the required operation of delay lines of types DI1, DI2, DI3, and DI4 for each Type of Operation and for each subcategory of Circuits Tested. An entry is made in this column to describe the operating function of each delay line type for each testing operation and category of circuits being tested. In this column, the notation "0" indicates that the input terminals of the corresponding delay line type are supplied with the signal value required to disable the off-chip drivers connected to such delay lines. The notation "1" indicates that the input terminals of the corresponding delay line type are supplied with the signal value required to permit selective enabling the off-chip drivers connected to such delay lines, based on test input stimulation of the system enable inputs of such drivers. The notation "S", meaning "Switched", indicates that the input terminals of the corresponding delay line type are switched either to a logical 0 or a logical 1 signal value as required during the execution of a required testing operation, to disable or selectively enable off-chip drivers as may be necessary to avoid driver-contention events. The notation "P", meaning "Pulsed", indicates that the input terminals of the corresponding delay line type are activated and then subsequently deactivated during each tester cycle in the manner described for the driver inhibit input shown in FIG. 2, thus permitting the staggered enabling and disabling of the associated off-chip drivers for purposes of avoiding the occurrence of simultaneous-output-switching events.

During wafer testing, the input terminals of type DI1 delay lines are held at logical 0 when circuits testable by SRL means are being tested, and so the corresponding off-chip drivers are disabled. When tests are performed that require activation of off-chip drivers to permit the transfer of data signal values, the input terminals of type DI1 delay lines are pulsed for simultaneous-output-switching control. During wafer testing, the input terminals of type DI2 delay lines can either be switched as needed to perform the required testing operations, or alternatively pulsed for avoidance of simultaneous-output-switching events. Inasmuch as the total number of off-chip drivers associated with LSSD test-function output signals is normally quite small, they do not themselves normally incur a risk of generating a simultaneous-output-switching event. During wafer testing, the chip being tested will have input terminals for type DI3 or DI4 delay lines only if that chip has been designed to be used in a multichip module. In such cases, type DI3 input terminals are treated identically with type DI2 input terminals, and type DI4 input terminal are treated identically with type DI1 input terminals.

During single-chip module testing, input terminals for type DI1 and DI2 delay lines are treated in the same manner as previously described for wafer testing. Inasmuch as type DI3 and DI4 delay lines are only used for multichip modules, these entries are not applicable for single-chip module testing.

During single-chip module stress operations, no monitoring of module output values is being done, so the input terminals for both type DI1 and DI2 delay lines are held at logical 0, thus disabling all off-chip driver circuits and electrically disconnecting them from their module output terminals, thereby preventing the risk of driver-contention events with other modules wired in common on the same burn-in board, and thereby also permitting the output terminals of some other module on the same burn-in board to be simultaneously tested by means of the same common wiring. Inasmuch as type DI3 and DI4 delay lines are only used for multichip modules, these entries are not applicable for single-chip module stress operations.

During multichip module testing, the chip input terminals for type DI1 and DI2 delay lines are wired to module input terminals, which are treated in the same manner as previously described for wafer testing. Chip input terminals for type DI3 delay lines need not be wired to module input terminals, but may be fixed to a constant logical 1 value as was illustrated by the multichip module examples in FIGS. 9 and 11. Alternatively, chip input terminals for type DI3 delay lines may be wired to module input terminals, in which case these input terminals are switched as necessary to perform all required testing operations. When multichip modules are designed in accordance with the method described in FIG. 8, then chip input terminals for type DI4 delay lines will be present. These type DI4 delay lines must be wired to module input terminals, and said terminals are switched as necessary to perform all required testing operations, and most particularly as required to avoid driver-contention events.

During multichip module stress operations, module input terminals for type DI1 and DI2 delay lines are treated in the same manner as previously described for single-chip module stress operations. Module input terminals for type DI3 and DI4 delay lines are treated in the same manner as previously described for multichip module testing.

Logic design methods that substantially associate shift register latches (SRLs) with device input and output terminals are known and have been called boundary scan methods. A scan boundary thus surrounding substantially all the chip logic not otherwise bounded by SRLs thereby permits all such combinational logic to be tested by means of LSSD loading, unloading, and clocking operations as previously described in reference to FIG. 1, but without also requiring that test input stimulus be applied to the input terminals having such associated SRLs, and also without requiring that test output response be monitored at the device output terminals having such associated SRLs.

Figure 14:
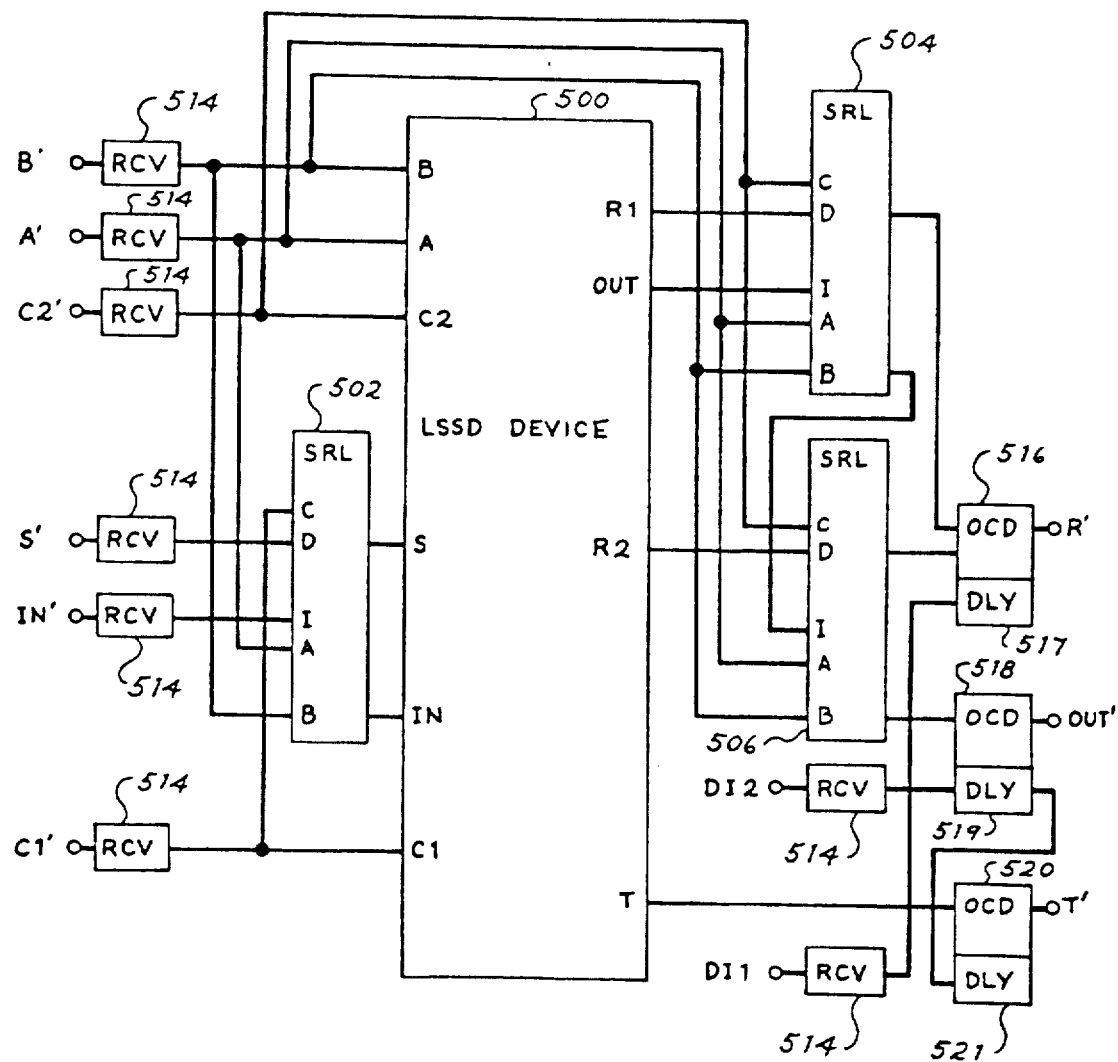
FIG. 14 illustrates an example of boundary scan device design, wherein the input and output terminal connections of LSSD device block 500 have been augmented to illustrate the receiver and driver circuits associated with the input and output terminals of the device, and also the addition of boundary scan SRLs in close association with data input terminal S′ and with data output terminal R′.

FIG. 13 and FIG. 14 illustrate the boundary scan principle in comparison to ordinary LSSD device design.

Figure 1:
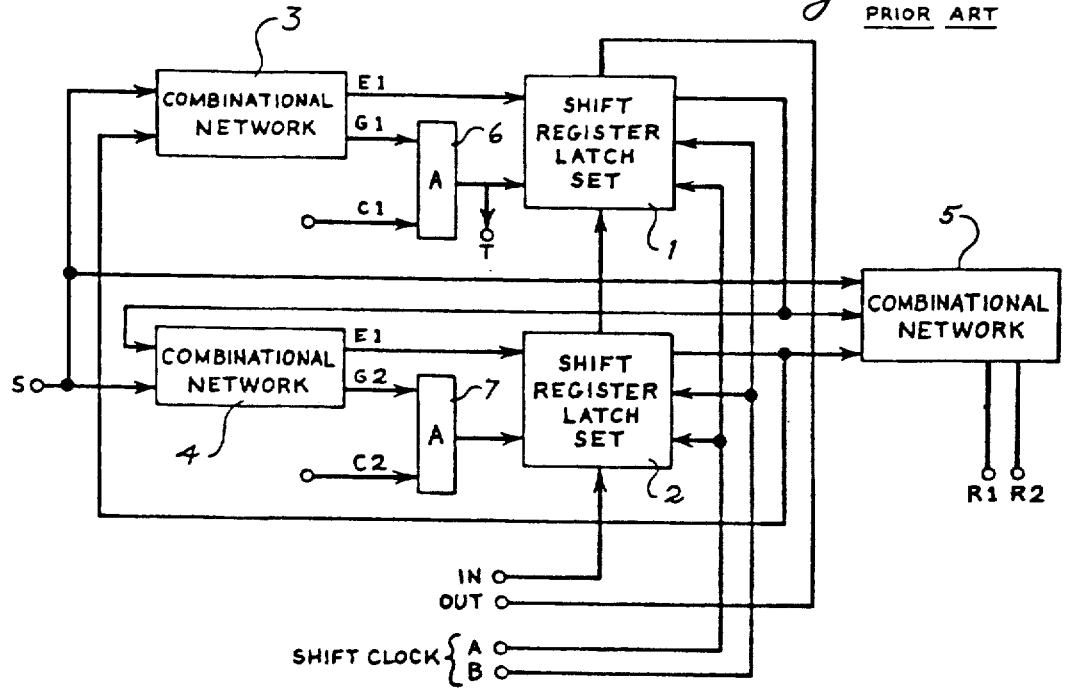
FIG. 1 is a schematic representation of a level sensitive scan design (LSSD) device.

FIG. 13 shows a block 500 containing the LSSD device depicted in FIG. 1, but showing only the input and output terminals of that device. FIG. 14 shows block 500 with boundary scan SRLs 502, 504, 506, driver inhibit terminals DI1 and DI2, and receivers 514 and drivers 516, 518, and 520. SRL 502 is a boundary SRL for data input signal S'. SRL 504 and SRL 506 are boundary SRLs for data output signal R'. SRLs 502, 504, and 506 constitute a logical boundary for 500 and provide stimulus and observation points to 500. DI1 controls the data off-chip driver 516 and DI2 controls the test-function off-chip drivers 518 and 520. 516, 518, and 520 are examples of block 102 as shown in FIG. 7B. In typical applications, there is a multiplicity of blocks 516, 518, and 520 connected together as shown in FIG. 7A, with 516 being the same as one block 102 and blocks 518 and 520 being the same as blocks 102'. In typical applications, the number of data inputs and data outputs greatly outnumbers the number of test-function inputs and outputs. For chips that will be packaged on MCMs, DI3 and DI4 are treated in the same manner as DI2 and DI1 respectively.

Boundary scan places a maximum number of functional circuit elements in the category SRL→SRL, which is a subset of category I/SRL→SRL, as described in reference FIG. 12, that excludes application of stimulus values to data input terminals as permitted by that category. All such circuit elements can be tested by holding DI1 to a logic 0 and monitoring only terminals OUT' and T', whose associated off-chip driver inhibit is controlled by a type DI2 delay line. In FIG. 14, 500, 502, 504, 506, 418, and 520 are part category SRL→SRL. Likewise, boundary scan places a minimum number of functional circuit elements in the category →DO/DO→whose associated off-chip driver inhibit is controlled by a type DI1 delay line. In FIG. 14, 516 is the only circuit that is part of this category.

Figure 3:
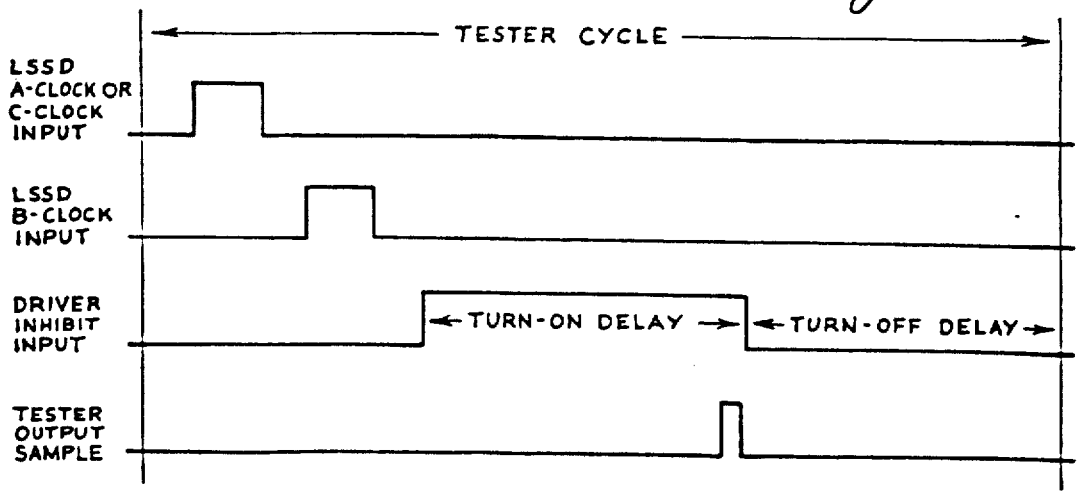
FIG. 3 is a timing diagram of a scan-testing cycle that illustrates the use of the delay structure of FIG. 2 to avoid the occurrence of simultaneous-output-switching events.
Figure 2A:
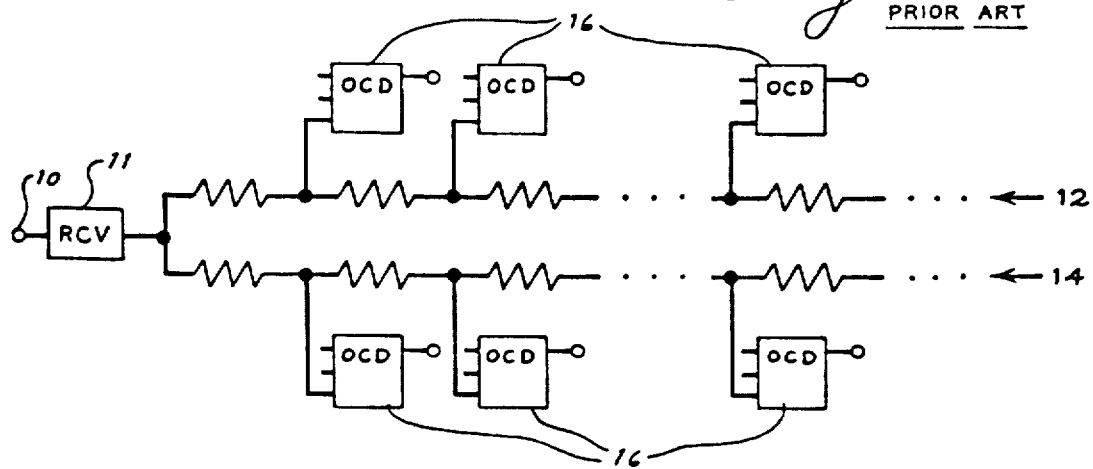
FIG. 2 is a diagram of a distributed resistive polysilicon delay line 12, 14, and of its interconnection to the control inputs of off-chip driver cells 16.
Figure 2B:
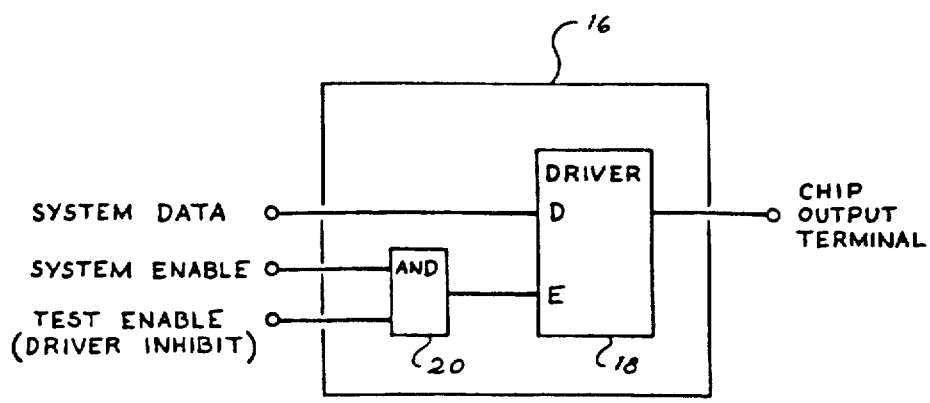
Figure 4:
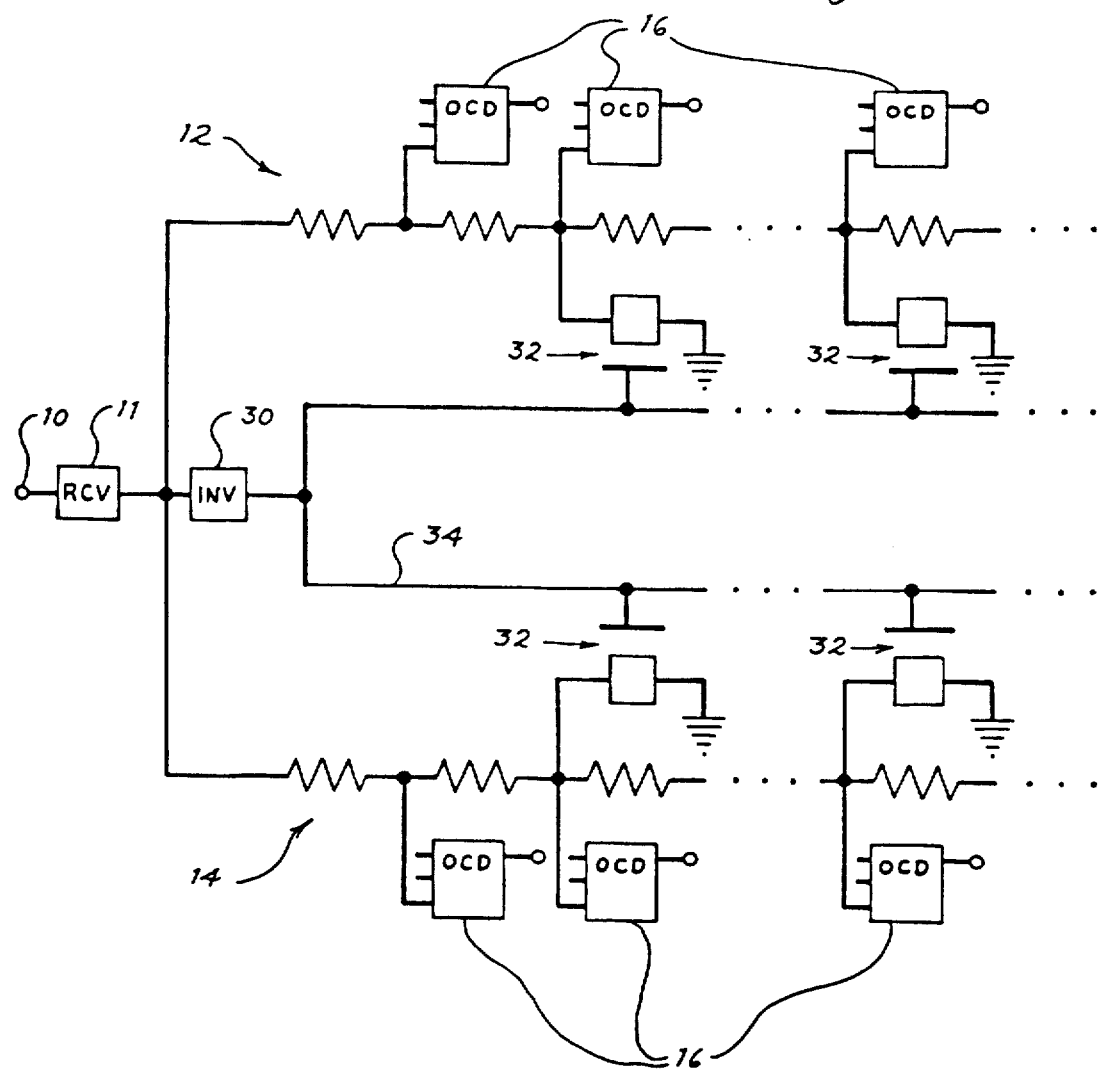
FIG. 4 is a diagram of a modified resistive delay line in which the turn-on (logical 0 to logical 1) delay line 12, 14 is identical to that of FIG. 2, but the turn-off (logical 1 to logical 0) delay has been provided by added circuitry 30, 32, 34.
Figure 5:
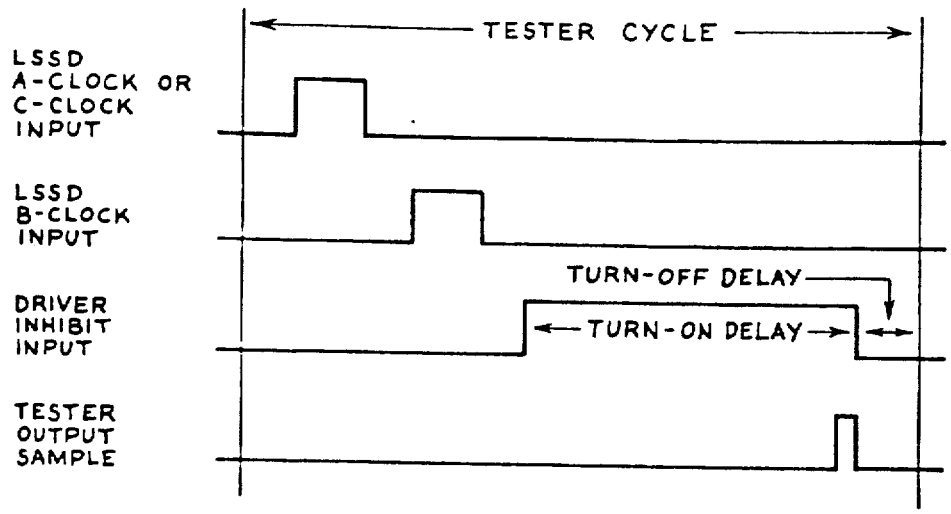
FIG. 5 is a timing diagram of a scan-testing cycle that illustrates the use of the delay structure of FIG. 4 to avoid the occurrence of simultaneous-output-switching events.
Figure 6:
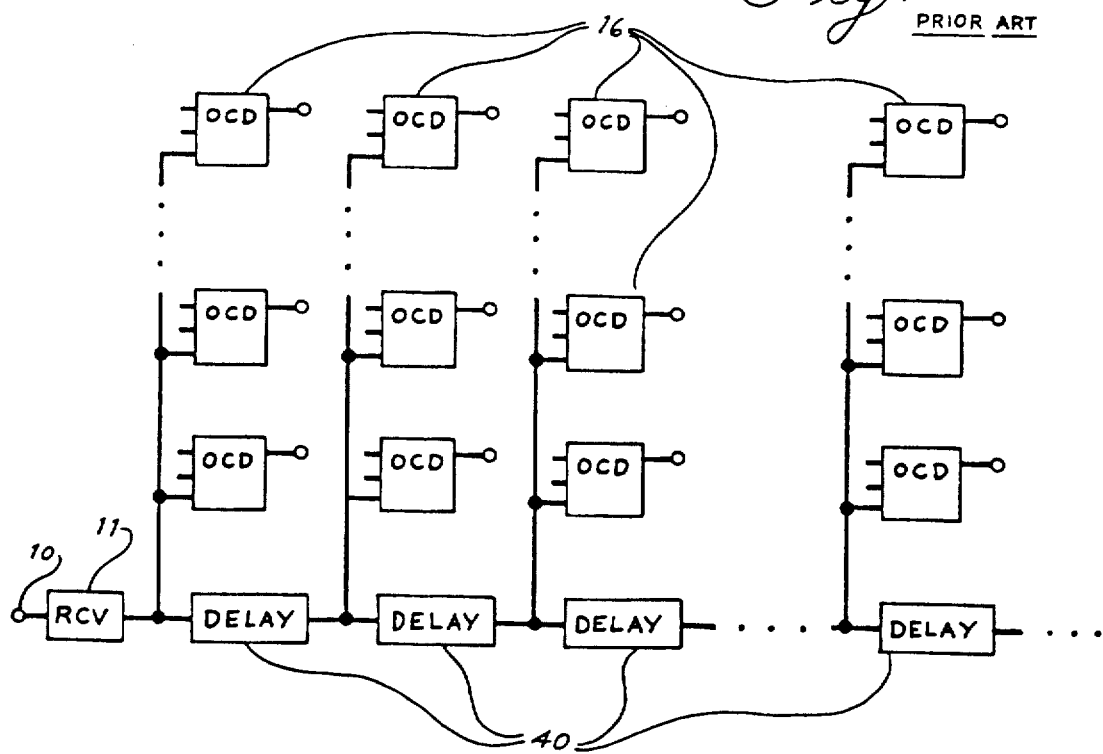
FIG. 6 is a block diagram of a representative interconnection of internal functional circuit elements 40 of a semiconductor device to form a distributed delay line, each delay element 40 also providing simultaneous control to a plurality of driver circuits 16.
Figure 15A:
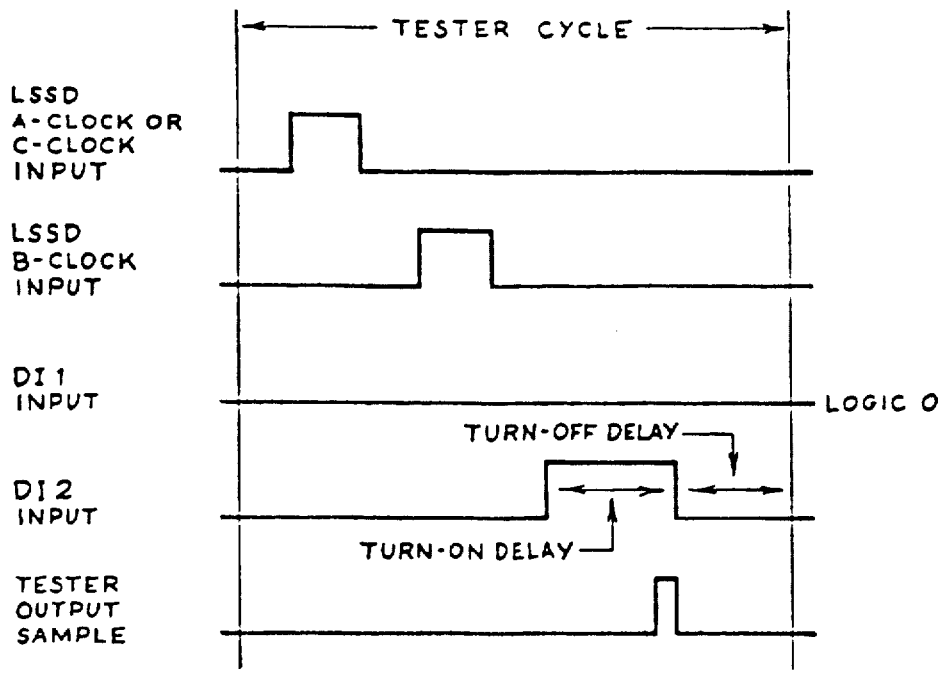
FIG. 15 is a timing diagram of a scan-testing cycle that illustrates the further testing cycle time benefit that may be obtained when the LSSD device being tested is a boundary scan device as exemplified by FIG. 14.
Figure 15B:
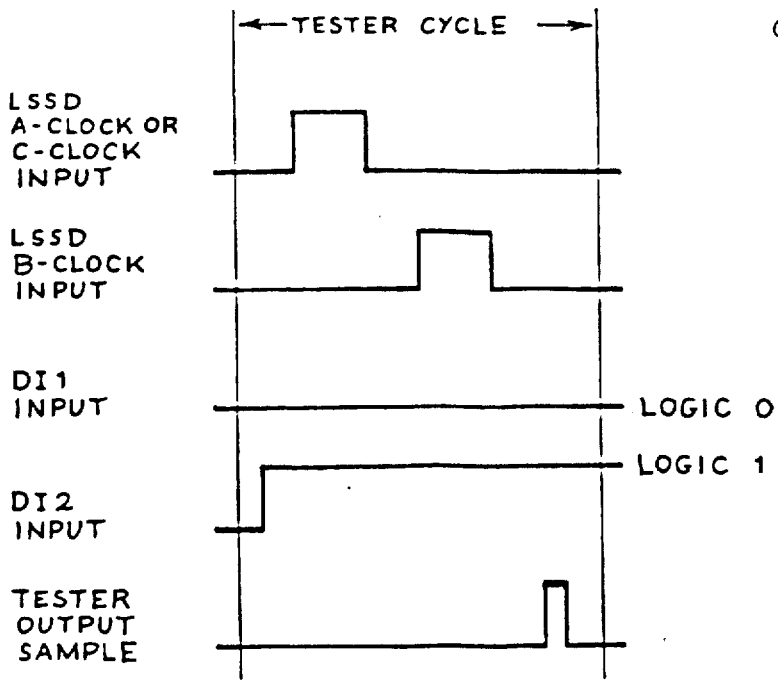

The further benefit derived from embodiments involving boundary scan design methods is that the tester cycle time as shown in FIG. 3 is further reduced as shown in FIG. 15 for the vast majority of tester cycles. FIG. 3 depicts the tester cycle time resulting from use of the delay lines as shown in FIG. 2 as applied to the circuits in FIG. 1. FIG 15 depicts tester cycle times illustrating the further improvements in such cycle times that can be realized in the testing of LSSD boundary scan device shown in FIG. 14 according to the present invention, as shown in FIG. 7. In FIG. 15A, note that a significant improvement is realized in comparison to the cycle time shown in FIG. 3 and that the cycling of the driver inhibit control input DI2 is no longer a dominant factor in the total tester cycle time. In FIG. 15B, a further improvement in tester cycle time is shown since the DI2 input is active for the entire cycle and the outputs can be sampled without the DI2 switching delay.

Monitoring of data output terminals for their expected signal response requires a tester cycle time similar to that of FIG. 3, but the impact to the tester cycle time is reduced since not all component drivers are controlled by DI1 and this delay is proportional to the number of outputs.

In testing MCMs, a further benefit is derived from the application of the present invention when boundary scan design methods are used. For chip-to-chip interconnect test, the number of tester cycles where DI4 is cycled is minimized because the complexity of the logic associated with chip-to-chip data interconnections is greatly simplified, therefore minimizing the number of test patterns needed. Further benefits derived from this invention are found at the electronic data processing system or subsystem level, hereafter called system. When components in a system contain SRLs, LSSD loading and unloading operations similar to that described in reference to FIG. 1 are also important operations during normal system operation. As in the various test modes, during LSSD loading and unloading operations, simultaneous-output-switching events, driver-contention events, and long scan cycle time are potential adverse effects to the system. With multiple driver inhibit delay lines provided in accordance with the principles of the present invention, the data drivers are inhibited and the test-function outputs are enabled during LSSD loading and unloading operations. This minimizes these potential adverse effects in the same manner as previously discussed for chips. While the invention has been particularly shown and described with reference to the preferred embodiments thereof, it will be understood by those skilled in the art that various changes in form and details may be made therein without departing from the spirit and scope of the invention.

What is claimed is:

1. A method for designing integrated circuit devices, said devices including a first plurality of off-chip driver circuit elements and a second plurality of off-chip driver circuit elements, comprising the steps of:

providing, in association with each of said off-chip driver circuit elements, separate inhibit means for inhibiting said elements in response to an inhibit signal;

providing, in association with each of said inhibit means, separate delay means for receiving and delaying an inhibit signal and for providing said inhibit signal to its associated inhibit means;

interconnecting said delay means associated with said first plurality of off-chip driver elements such that such delay means are interconnected serially in a first delay line; and interconnecting said delay means associated with said second plurality of off-chip driver elements such that such delay means are interconnected serially in a second delay line; such that during test or other operation of said circuit device, inhibit signals may be applied selectively to said first and second delay lines so as to minimize simultaneous driver switching while concurrently minimizing the delay in switching associated with said delay lines.

2. A method according to claim 1 wherein circuit elements are provided in accordance with a design system that provides such elements in cells for interconnection with a desired circuit design, wherein said step of providing separate inhibit means is performed by providing said inhibit means in a plurality of cells in which said associated plurality of off-chip drivers is provided; and wherein said step of providing separate delay means is performed by providing said delay means in a plurality of cells in which said associated plurality of inhibit means is provided.

3. A method according to claim 1 or claim 2 in which said step of providing said delay means is performed by providing a plurality of inverters interconnected serially.

4. A method according to claim 1, further including the step of providing shift register latches on said devices for serially scanning test and data signals as outputs from said circuit devices.

5. An integrated circuit device including a first plurality of off-chip driver circuit elements and a second plurality of off-chip driver circuit elements, comprising:

separate inhibit means, provided in association with each of said off-chip driver circuit elements, for inhibiting said elements in response to an inhibit signal;

separate delay means, provided in association with each of said inhibit means, for receiving and delaying an inhibit signal and for providing said inhibit signal to its associated inhibit means;

said delay means associated with said first plurality of off-chip driver elements being interconnected such that such delay means are interconnected serially in a first delay line; and said delay means associated with said second plurality of off-chip driver elements being interconnected such that such delay means are interconnected serially in a second delay line;

such that during test or other operation of said circuit device, inhibit signals may be applied selectively to said first and second delay lines so as to minimize simultaneous driver switching while concurrently minimizing the delay in switching associated with said delay lines.

6. A device according to claim 5 wherein said circuit elements are provided in cells interconnected in accordance with a desired circuit design, wherein each of said separate inhibit means are provided in a one of said cells in which its associated off-chip driver is provided; and wherein said separate delay means are provided in a one of said cells in which its associated inhibit means is provided.

7. A device according to claim 5 or claim 6 in which said delay means is a plurality of inverters interconnected serially.

8. A device according to claim 5, further comprising a plurality of shift register latches for serially scanning test and data signals as outputs from said circuit devices; and wherein said first plurality of off-chip driver circuit elements are provided in association with the outputs of said shift register latches.

9. A method for testing an integrated circuit device, said device including input and output terminals and functional logic circuit elements for performing logical operations on signals applied as inputs thereto, comprising the steps of:

providing a first plurality of off-chip driver circuit elements;

providing a second plurality of off-chip driver circuit elements;

providing, in association with each of said off-chip driver circuit elements, separate inhibit means for inhibiting said elements in response to an inhibit signal;

providing, in association with each of said inhibit means, separate delay means for receiving and delaying an inhibit signal and for providing said inhibit signal to its associated inhibit means;

interconnecting said delay means associated with said first plurality of off-chip driver elements such that such delay means are interconnected serially in a first delay line;

interconnecting said delay means associated with said second plurality of off-chip driver elements such that such delay means are interconnected serially in a second delay line; applying test input signals to said input terminals, including data signals and clock signals; and applying inhibit signals selectively to said first and said second delay lines while monitoring selected output terminals of said device so as to minimize simultaneous driver switching while concurrently minimizing the delay in testing associated with said delay lines.

10. A method according to claim 9, further including the step of providing shift register latches on said devices for serially scanning test and data signals as outputs from said circuit devices, wherein said first plurality of off-chip driver circuit elements are provided in association with said shift register latches.

11. A method according to claim 9 wherein said testing is performed on one or more of such integrated circuit devices mounted on a single module, and wherein said step of providing said first plurality of off-chip driver circuit elements is performed by providing said driver circuit elements only for outputs intended as outputs of said module.

12. A method according to claim 9 wherein said testing is performed on one or more of such integrated circuit devices mounted on a single module, further including the step of:

providing shift register latches on said devices for serially scanning test and data signals as outputs from said circuit devices; and wherein said step of providing said first plurality of off-chip driver circuit elements is performed by a first step of providing said driver circuit elements only for outputs required for obtaining those outputs from said shift register latches also intended as outputs of said module.

13. A method according to claim 12, wherein said step of providing said second plurality of off-chip driver circuit elements is performed by a second step of providing said driver circuit elements only for those outputs of said module not having driver circuit elements provided by said first step.

14. A method according to claim 13, wherein said module contains a plurality of integrated circuit devices, further including the step of providing a third plurality of off-chip driver circuit elements only for those outputs intended only as an input to one or more devices on said module; and wherein said steps of providing separate inhibit means further includes the step of providing such separate inhibit means in association with said third plurality of off-chip driver circuit elements.

* * * * *